US 6,587,005 B2

(12) United States Patent
Ichihara

(10) Patent No.: US 6,587,005 B2
(45) Date of Patent: Jul. 1, 2003

(54) PLL CIRCUIT HAVING A VARIABLE OUTPUT FREQUENCY

(75) Inventor: Masaki Ichihara, Minato-ku (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/023,804

(22) Filed: Dec. 21, 2001

(65) Prior Publication Data

US 2002/0089384 A1 Jul. 11, 2002

(30) Foreign Application Priority Data

Jan. 9, 2001 (JP) .................................. 2001-001232

(51) Int. Cl.⁷ .......................... H03L 7/08; H03L 7/099; H03L 7/16; H03L 7/18
(52) U.S. Cl. .......................... 331/16; 331/17; 331/36 C
(58) Field of Search .......................... 331/10, 11, 16, 331/17, 18, 25, 36 R, 36 C, 177 V, DIG. 2; 327/156–159; 332/127; 360/51; 375/376; 455/260

(56) References Cited

U.S. PATENT DOCUMENTS 5,254,958 A  * 10/1993  Flach et al. .................. 331/10
5,600,279 A  * 2/1997   Mori .......................... 331/36 C
5,821,818 A  * 10/1998  Idei et al. .................... 331/17
6,433,644 B2 * 8/2002   Andrews ....................... 331/10

FOREIGN PATENT DOCUMENTS

| JP | 5-29932 A    | 2/1993 |
| JP | 6-140837 A   | 5/1994 |
| JP | 2001-94419 A | 4/2001 |

* cited by examiner

*Primary Examiner*—David C. Mis
(74) *Attorney, Agent, or Firm*—Sughrue Mion, PLLC

(57) ABSTRACT

A phase locked loop (PLL) circuit includes a voltage controlled oscillator (VCO) having a parallel resonant circuit including a first capacitance implemented by a reverse-biased diode and a second capacitance implemented by MOS capacitors. Upon lock-in of the oscillation frequency with respect to the reference frequency, whether the oscillation frequency has a deviation is examined based on the tune voltage controlling the first variable capacitance. If a deviation is observed due to a temperature fluctuation etc., the control voltage for the second variable capacitance is corrected for compensating the deviation.

15 Claims, 10 Drawing Sheets

PLL CIRCUIT HAVING A VARIABLE OUTPUT FREQUENCY

BACKGROUND OF THE INVENTION (a) Field of the Invention

The present invention relates to a phase locked loop (PLL) circuit having a variable output frequency and, more particularly, to an improvement of such a PLL circuit to have an adjustable output frequency.

(b) Description of the Related Art

PLL circuits are used in a variety of equipment for generating a local oscillation frequency. The PLL circuit should have lower dimensions and be manufactured at a lower cost by, for example, reducing the number of electronic components thereof, in view that the PLL circuit is now installed in a mobile telephone or a GPS receiver which is ever requested to have a lower weight and smaller dimensions.

FIG. 1 shows a conventional PLL circuit, which includes a VCO 41, an N-divider 47 for dividing the output signal from the VCO 41 by a number of N to output an N-divided frequency signal, a reference frequency oscillator 46, an R-divider 45 for dividing the reference frequency by a number of R to output an R-divided frequency signal, a register 48 for storing the number N, a register 49 for storing the number R, a phase comparator 44 for comparing the phase of the N-divided frequency signal against the phase of the R-divided frequency signal, a charge pump 43 for receiving the result of the comparison from the phase comparator 44, and a loop filter (low-pass filter) 42 for passing the low-frequency component of the output from the charge pump 43 to generate a control voltage for the VCO 41. Thus, a negative feedback loop is formed in the PLL circuit.

The control signal from the loop filter 42 is substantially an integrated signal of the difference between the phase of the output from the N-divider 48 and the phase of the output from the R-divider 49. The output frequency from the VCO 41 is used as a local oscillation frequency signal during modulation or demodulation in a mobile telephone, for example.

The number N for dividing the output from the VCO 41 in the N-divider 47 is stored in the register 48 which receives the number N from a CPU disposed outside the PLL circuit.

A temperature-compensated crystal oscillator (TCXO) is generally used as the reference frequency oscillator 46. The number R for dividing the reference frequency in the R-divider 45 is stored in the register 49, which receives the number R from the external CPU. The numbers N and R are fed to the PLL circuit at the timing of a strobe signal.

The negative feedback loop of the PLL circuit allows the output oscillation frequency thereof to lock in a specified frequency defined by the reference frequency and the numbers N and R. More specifically, the output oscillation frequency $f_{VCO}$ from the VCO 41 is expressed by a function of the reference frequency $f_{tCXO}$ and the numbers N and R as follows:

$$f_{VCO} = N \times f_{tXCO}/R \quad (1).$$

In general, the electronic components of the PLL circuit as described above can be integrated in a single LSI or LSI ship except for the VCO 41 and the reference frequency oscillator 46. The reference frequency oscillator 46 is not integrated in the LSI because the crystal oscillator cannot be installed in the LSI and an accurate frequency oscillator having a temperature-compensated output frequency cannot be manufactured without the crystal oscillator.

The VCO 41 is not integrated in the LSI in the prior art because the output frequency of the VCO significantly fluctuates due to the fluctuation of the ambient temperature and the variance or scattering of the characteristics of the components thereof and an adjustment of the output frequency in the LSI for compensating the temperature fluctuation etc. to obtain an accurate oscillation frequency is difficult to achieve. Thus, the VCO 41 is generally disposed in a dedicated package, adjusted to generate an accurate frequency range and have suitable temperature characteristics before installation, and then installed in the PLL circuit as a dedicated component disposed outside the LSI.

Some proposals were presented recently to install the VCO in a LSI. For example, a literature entitled "A Low Phase Noise Monolithic VCO in SiGe BiCMOS" by J. M. Mourant, J. Imboronen and Teksbury, in digest of papers, pp 65–68, 2000 IEEE Radio Frequency Integrated Circuits Symposium, describes the VCO shown in FIG. 2. FIG. 3 also shows a simplified equivalent circuit diagram of the VCO of FIG. 2. It is to be noted that FIG. 3 shows only a single end of the equivalent circuit of FIG. 2, which has the configuration of a typical differential oscillator generally used in a LSI.

The differential oscillator shown in FIG. 2 includes a plurality of pairs of pMOS transistors M00 and M10, M01 and M11, M02 and M12, and M03 and M13, wherein the sources and drains of each pair of pMOS transistors are connected together to form a serieal MOS capacitor pair. A control voltage CONT0, CONT1, CONT2 or CONT3 is applied to the common sources and drains of each transistor pair to vary the capacitance of each MOS capacitor, thereby forming a variable capacitance. These variable capacitances are shown by reference symbols C0, C1, C2 and C3 in FIG. 3.

A pair of diodes D04 and D14 having cathodes connected to the gates of the respective pMOS transistors and anodes connected together. A tune voltage signal TUNE having a potential lower than VCC is applied to the anodes of the diodes D04 and D14 to reverse-bias the diodes D04 and D14, thereby forming another capacitor pair having a variable capacitance, which is shown by a reference symbol C4 in FIG. 3.

A pair of bipolar transistors Q01 and 11 are provided each having a base applied with a voltage which divides the collector voltage of the other of the bipolar transistors Q01 and Q11 by a capacitor C05 or C15 and a reactor L12 or L02. Each of the bipolar transistors Q01 and Q11 thus has a negative resistance −R shown by the symbol Q1 in FIG. 3. A pair of coils L01 and L11 are connected between the power source line VCC and the gates of respective pMOS transistors, corresponding to the inductance L1 in FIG. 3.

In FIG. 3, the inductance L1 and the variable capacitances C0 to C4 form a parallel resonant circuit.

By achieving a negative resistance −R in the bipolar transistors which cancels the total resistance R of the resistance components of the variable capacitances C0 to C4 and the inductance L1 in FIG. 3, the parallel resonant circuit oscillates at a resonance frequency $f_{OSC}$:

$$f_{OSC} = 1/\{2\pi(L1 \times (C0+C1+C2+C3+C4))^{1/2}\} \quad (2).$$

Although the inductance L1 is realized by the coil installed in a LSI and thus cannot be controlled for the value, the resonance frequency $f_{OSC}$ can be varied by controlling the control voltages CONT0, CONT1, CONT2 and CONT3 applied to the variable capacitances C0 to C3 and a tune voltage TUNE applied to the variable capacitance C4.

Referring to FIG. 4, among other variable capacitances, the variable capacitance C4 reduces monotonically with the increase of the reverse-bias voltage due to the decrease of the depletion layer in the vicinity of the P-N junction. More specifically, the variable capacitance C4 decreases in inverse proportion to the square root of the reverse-bias voltage. The reverse-bias voltage is generated between the VCC voltage and the tune voltage TUNE which is applied to the anodes of the diodes D04 and D14 in FIG. 2. Thus, the resonance frequency decreases with the decrease of the tune voltage TUNE, and increases with the increase of the to tune voltage.

Each of the variable capacitances C0 to C3 shown in FIG. 4 changes abruptly between a lower capacitance $C_{low}$ and a higher capacitance $C_{high}$ at a threshold voltage which resides between V1 and V0 of the bias voltage. These capacitances $C_{low}$ and $C_{high}$ are stable for each of the variable capacitances C0 to C3. Accordingly, each of the variable capacitances can be controlled to have binary values by applying a gate voltage of V0 or V1 to the MOS capacitors.

The four MOS capacitor pairs have transistor sizes different from the transistor sizes of the other pairs, wherein the transistor size of the MOS capacitor having a specified order, for example M01 or M11, is double the transistor size of the MOS capacitor having an adjacent order, M00 or M10.

FIG. 5 shows the variable frequency range achieved by controlling the four-bit control signal applied to the variable capacitances C0 to C3 as well as controlling the tune voltage TUNE. The four control signals CONT0 to CONT3 correspond to the respective bits of a four-bit code or combination control signal, wherein CONT0 for the variable capacitance C0 corresponds to the least significant bit and CONT3 for the variable capacitance C3 corresponds to the most significant bit of the control signal. The variable frequency range shown by a double-arrow line for each code corresponds to the variable range of the variable capacitance C4. As shown in FIG. 5, by changing the selected code from "0000" to "1111", the oscillation frequency $f_{OSC}$ can be changed stepwise for sixteen steps, with the tune voltage being controlled to change the oscillation frequency continually at each of the sixteen steps.

The above literature describes realization of the VCO which is installed in a LSI and has a variable oscillation frequency. In the described VCO, it is possible to control the output oscillation frequency by adjusting the tune voltage applied to the variable capacitance C4 and the control voltage applied to the variable capacitances C0 to C3. However, the literature is silent as to the techniques for detecting the deviation of the output oscillation frequency of the VCO from a specified frequency due to a temperature fluctuation or variance or scattering of the characteristics of the electronic components thereof, and for controlling the oscillation frequency at the specified frequency.

SUMMARY OF THE INVENTION

In view of the above, it is an object of the present invention to provide a practical PLL circuit which is capable compensating the deviation of the output frequency caused by a temperature fluctuation and variance or scattering of the characteristics of the components in the VCO, whereby the VCO can be integrated in a LSI constituting the PLL circuit substantially without loosing an accuracy of the output frequency.

The present invention provides a phase locked loop (PLL) circuit including: a reference frequency generator for generating a reference frequency signal having a reference frequency; a voltage controlled oscillator (VCO) including first and second variable capacitances, the VCO oscillating at an oscillation frequency based on the first and second variable capacitances; a first frequency divider for dividing the oscillation frequency by a first number to output a first frequency signal; a phase comparator for comparing a phase of the first frequency signal against a phase of the reference frequency signal to output a comparison result signal; a tune signal generation section for receiving the comparison result signal to output a tune signal, the tune signal controlling the first variable capacitance; a frequency control unit for generating a control signal controlling the second variable capacitances; and a lock-in detection section for detecting a lock-in of the oscillation frequency with respect to the reference frequency, the frequency control unit detecting, upon detection of a lock-in by the lock-in detection section, a deviation of the oscillation frequency from a normal oscillation frequency based on the tune signal, the first number and the reference frequency, the frequency control unit correcting the control signal based on the detected deviation.

In accordance with the PLL circuit of the present invention, the deviation of the output oscillation frequency, upon lock-in of the PLL circuit with respect to the reference frequency, can be corrected by adjusting the control signal for the second variable capacitance based on the tune signal detected by the frequency control unit. In addition, the VCO can be integrated in a LSI while allowing the compensation of the deviation in the output oscillation frequency caused by a temperature fluctuation or variance or scattering of the characteristics of the components of the LSI.

The above and other objects, features and advantages of the present invention will be more apparent from the following description, referring to the accompanying drawings.

PREFERRED EMBODIMENTS OF THE INVENTION

Figure 6:
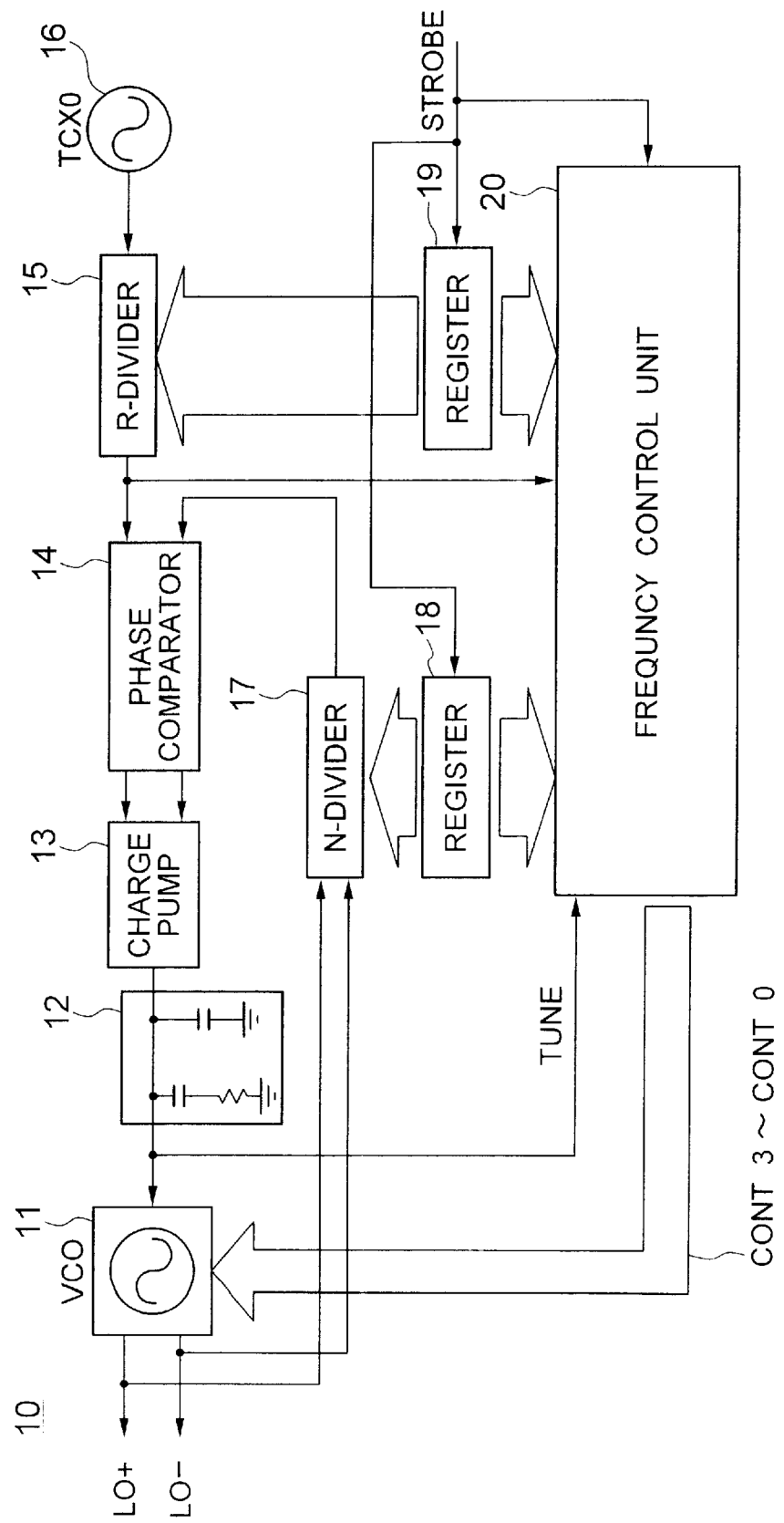
FIG. 6 is a block diagram of a PLL circuit according to a first embodiment of the present invention.

Referring to FIG. 6, a PLL circuit, generally designated by numeral 10, according to a first embodiment of the present invention includes a VCO 11, an N-divider 17 for dividing the output signal from the VCO 41 by a number of N, a reference frequency oscillator 16, an R-divider 15 for dividing the reference frequency by a number of R, a register 18 for storing the number N, a register 19 for storing the number R, a phase comparator 14 for comparing the phase of the N-divided frequency signal output from the N-divider 18 against the phase of the R-divided frequency signal output from the R-divider 19, a charge pump 13 for receiving the output from the phase comparator 14, a loop filter 12 for passing the low-frequency component of the output from the charge pump 13 to generate a tune signal for the VCO 11, and a frequency control unit 20 for detecting the deviation of the output oscillation frequency of the VCO 11 from a specified frequency to control the oscillation frequency based on the detected deviation.

The tune signal from the low-pass filter 12 is substantially an integrated signal of the difference between the phase of the output from the N-divider 17 and the phase of the output from the R-divider 15. The output frequency from the VCO 11 is used as a is local oscillation signal during modulation or demodulation in a mobile telephone, for example.

The number N for dividing the output frequency from the VCO 11 in the N-divider 17 is stored in the register 18, which receives the number N from a CPU disposed outside the PLL circuit 10. The number R for dividing the reference frequency is stored in the register 19, which receives the number R from the CPU. The data of numbers N and R are fed to the PLL circuit 10 at the timing of the strobe signal.

Figure 1:
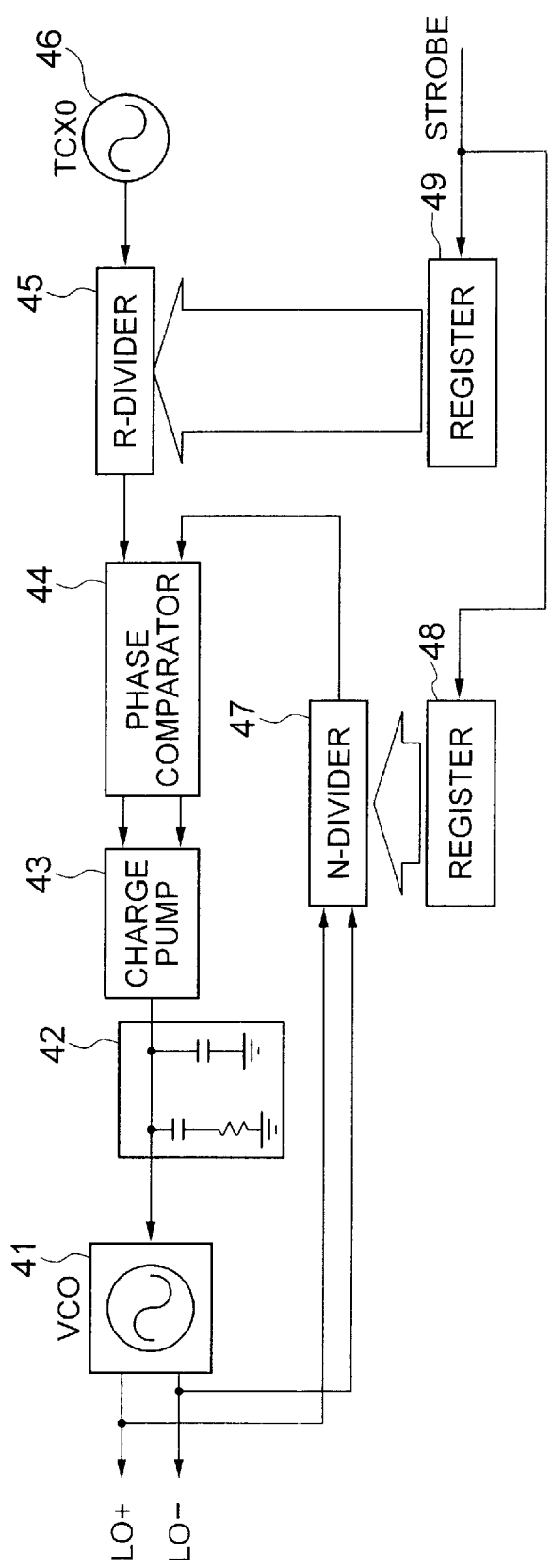
FIG. 1 is a block diagram of a conventional PLL circuit.
Figure 2:
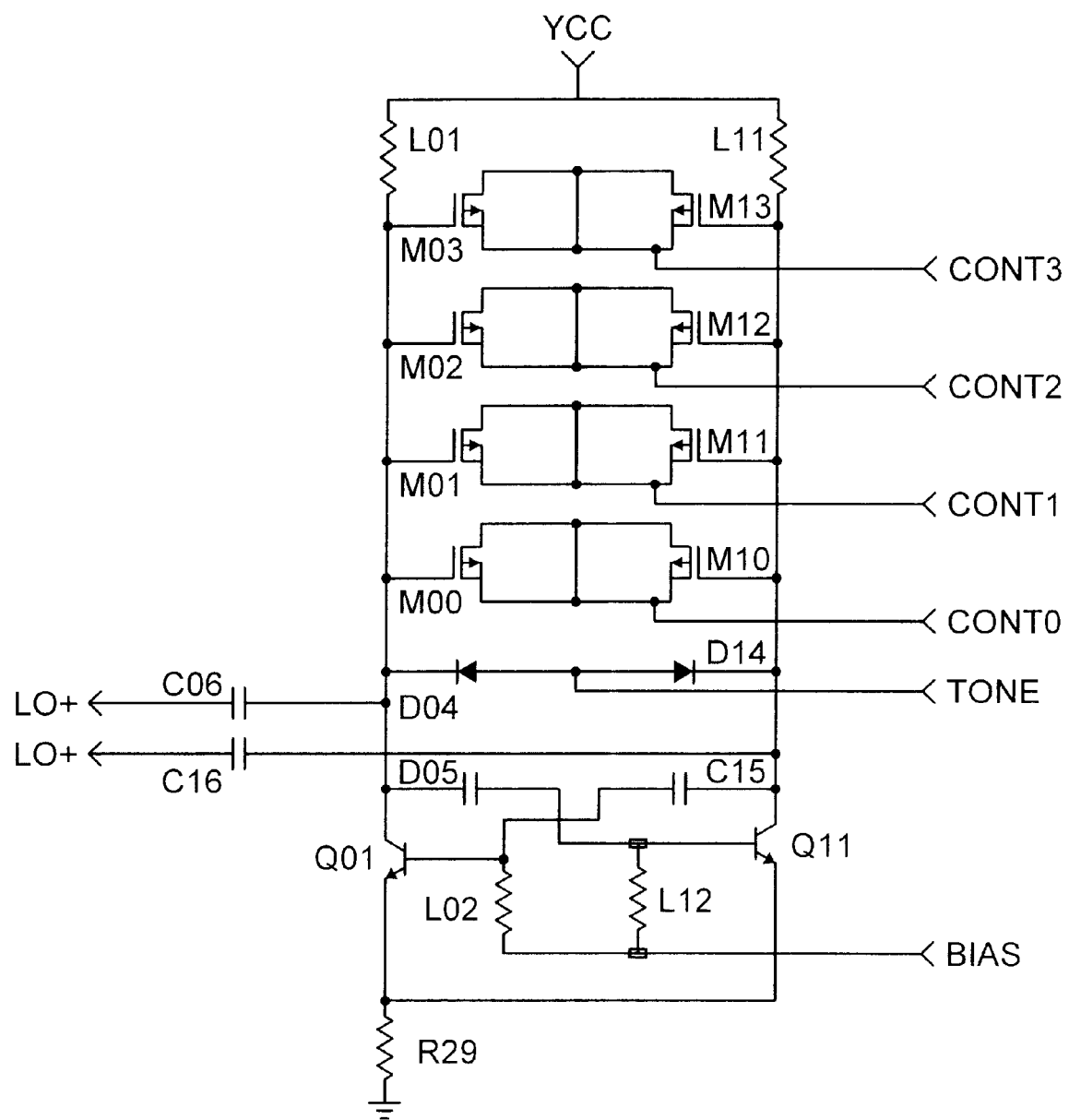
FIG. 2 is a circuit diagram of the VCO described in a publication.

The PLL circuit 10 of the present embodiment is similar to the PLL circuit of FIG. 1 except for the following:

the PLL circuit 10 includes the VCO 11 shown in FIG. 2; and the PLL circuit 10 includes the frequency control unit 20 which receives a voltage signal or tune signal from the loop filter 12, the numbers N and R from the registers 18 and 19, respectively, to output the four bits CONT0 to CONT 3 of the control signal to the VCO 11 for controlling the output oscillation frequency of the VCO 11.

Figure 7:
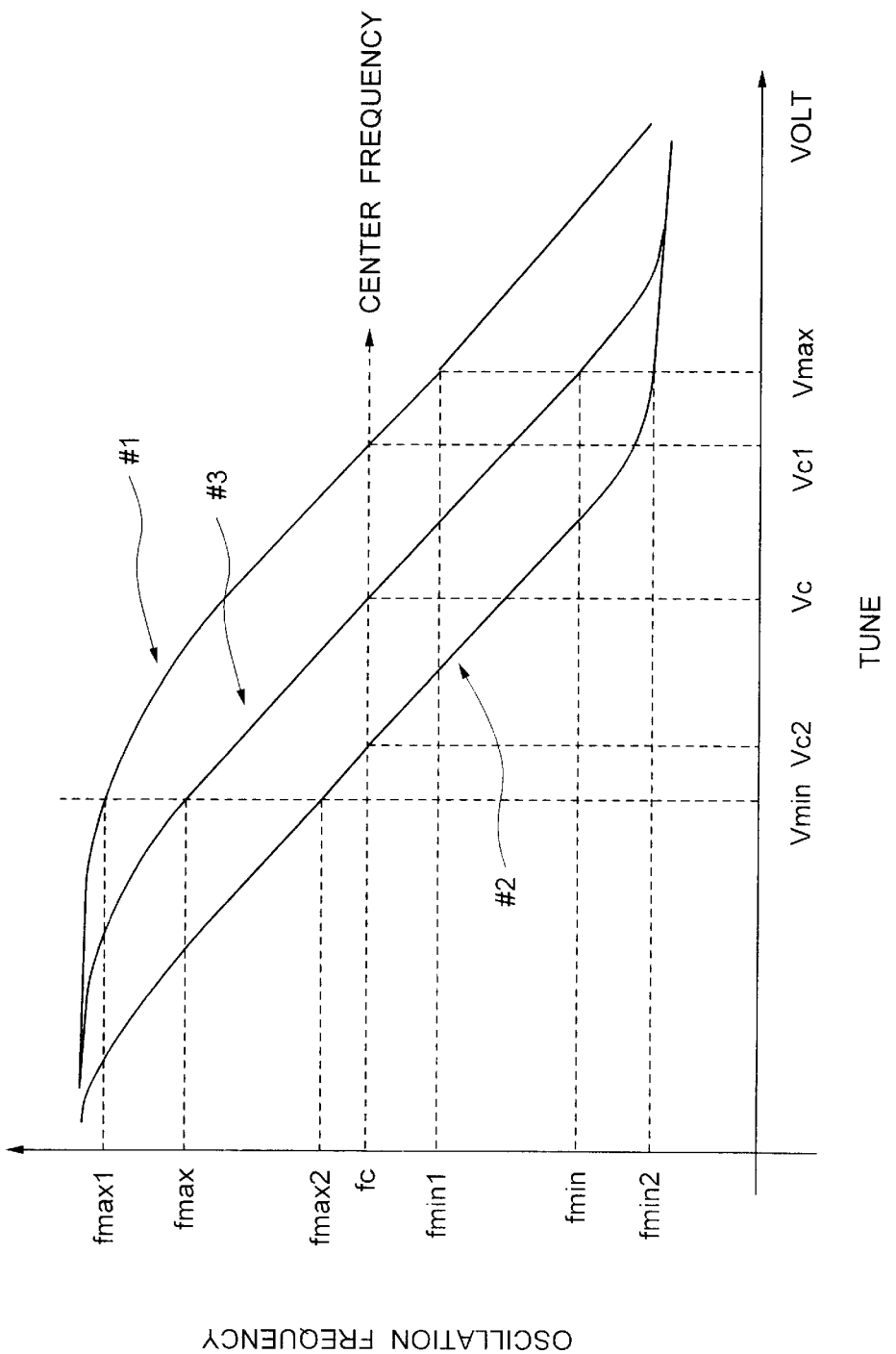
FIG. 7 is a graph showing the tune voltage dependency of the oscillation frequency of the VCO of FIG. 6.

The frequency control unit 20 monitors the tune voltage TUNE to control the oscillation frequency. FIG. 7 shows the relationship between the tune voltage TUNE and the oscillation frequency, wherein Curve #3 illustrates a case of an optimum frequency with respect to the reference frequency and numbers N and R, Curve #1 illustrates a case of higher oscillation frequency and Curve #2 illustrates a case of lower oscillation frequency. In these curves, the oscillation frequency reduces monotonically with the increase of the tune voltage, as described before.

As shown in FIG. 7, in the case of the optimum oscillation frequency shown by Curve #3, a normal oscillation frequency or center frequency fc is obtained by a tune voltage equal to Vc. If the reference frequency from the reference frequency oscillator 16 is known, the frequency fc can be calculated from the numbers N and R based on the formula (1). Thus, the tune voltage Vc corresponding to the center frequency fc can be calculated beforehand.

Assuming that the oscillation frequency from the VCO 11 deviates from Curve #3 to Curve #1, upon a lock-in of the oscillation frequency fc, the tune voltage TUNE assumes Vc1 which is higher than Vc. On the other hand, if the oscillation frequency from the VCO 11 deviates from Curve #3 to Curve #2, upon a lock-in of the oscillation frequency fc, the tune voltage assumes Vc2 which is lower than Vc.

In other words, if the tune voltage TUNE is higher than Vc, then it is considered that the oscillation frequency is higher than the optimum situation, whereas if the tune voltage TUNE is lower than Vc, then it is considered that the oscillation frequency is lower than the optimum situation. The present embodiment uses this principle.

Figure 8:
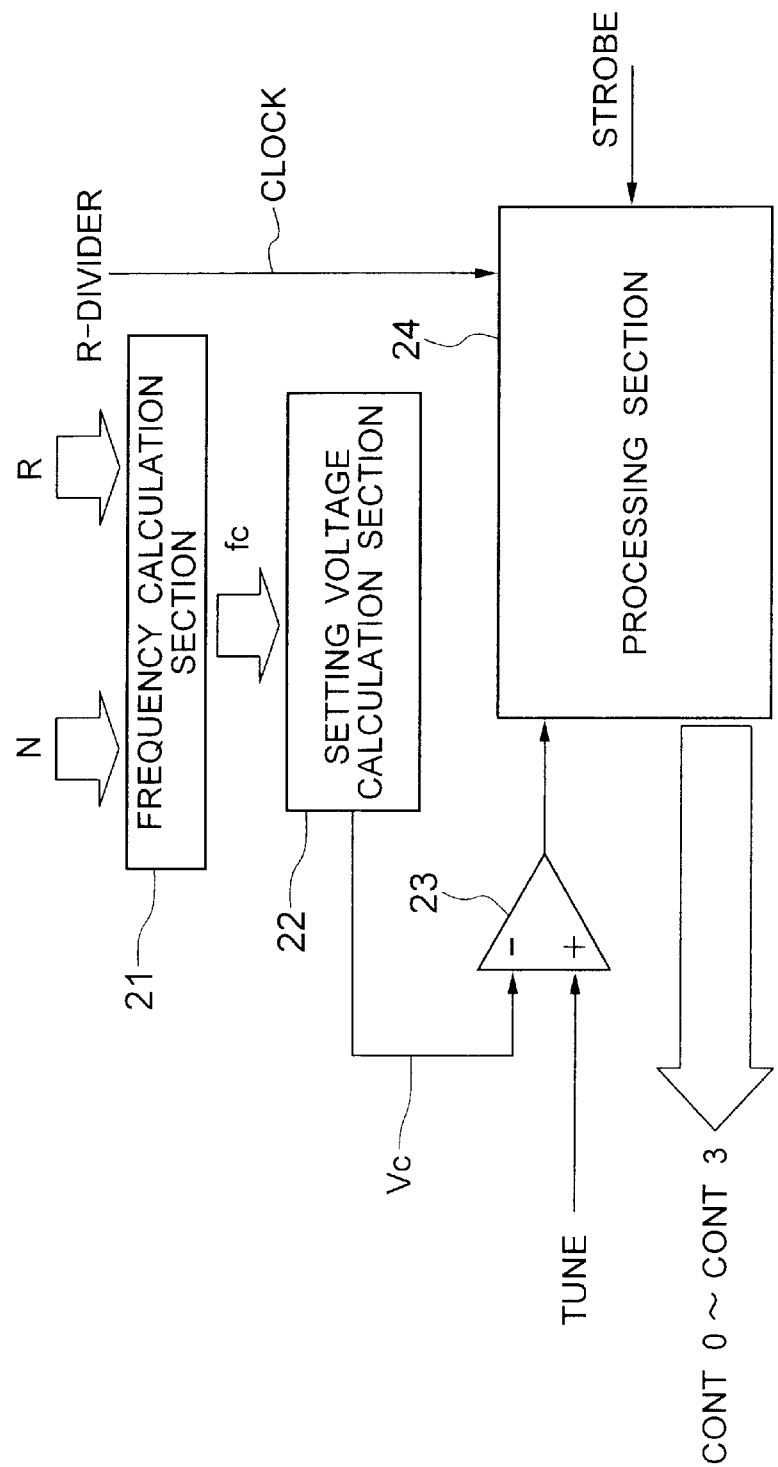
FIG. 8 is a block diagram of the frequency control unit shown in FIG. 6.

Referring to FIG. 8, the frequency control unit 20 includes a frequency calculation section 21 for receiving the data of numbers N and R to calculate therefrom the normal (center) oscillation frequency fc based on the reference frequency and the formula (1), a setting voltage calculation section 22 for calculating a setting voltage Vc from the calculated normal oscillation frequency fc based on the graph such as Curve #3 shown in FIG. 7, a comparator 23 for comparing the tune voltage TUNE from the loop filter 12 against the setting voltage Vc, and a processing section 24 for adjusting the control signal having four bits CONT0–CONT3 based on the result of the comparison to feed the adjusted control signal to the VCO 11.

The frequency calculation section 21 is implemented in a CPU. The setting voltage calculation section 22 is implemented in a CPU, or may be implemented by a ROM or a D/A converter.

The comparator 23 compares the tune voltage TUNE output from the loop filter 12 against the setting voltage Vc to judge whether the tune voltage TUNE is higher or lower than the setting voltage Vc, whereby the processing section 24 judges whether the oscillation frequency should be lowered or raised, as detailed below.

Figure 9:
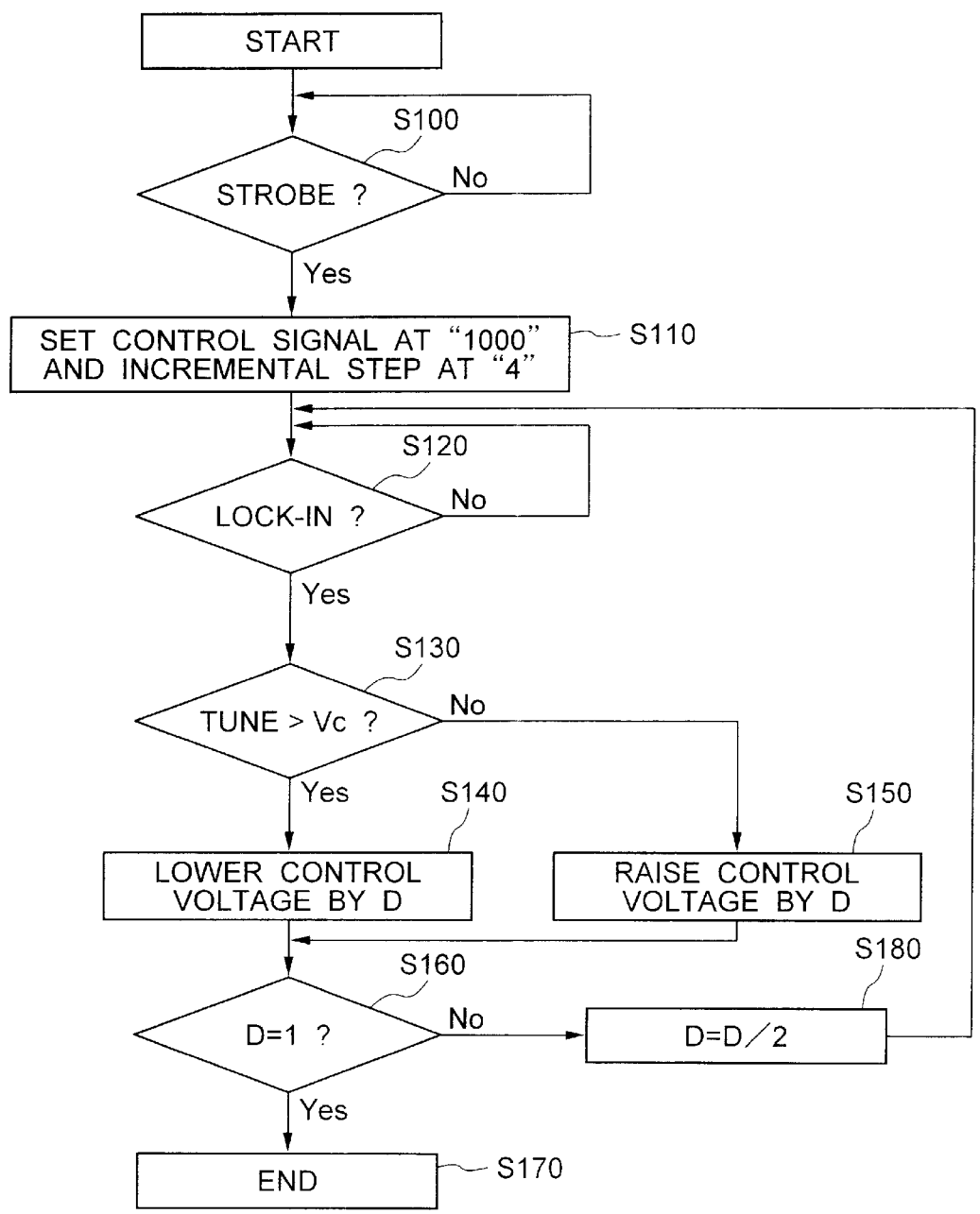
FIG. 9 is a flowchart of the operation of the frequency control unit of FIG. 8.

Referring to FIG. 9, the processing section 24 awaits an occurrence of a strobe signal, and responds to a strobe signal at step S100, setting the control signal at "1000" or $8_{10}$ and the initial incremental step "D" for the control signal at 410 (step S110). The selected control signal "1000" is a median between "1111" and "0000", whereas the selected incremental step 410 corresponds to ¼ of the 16 steps achieved by the four-bit control signal.

Subsequently, the processing section 24 awaits a lock-in of the PLL circuit, and responds to a lock-in at step S120, judging at step S130 whether the tune voltage TUNE from the loop filter 12 is higher or lower than the setting voltage Vc. If the tune voltage is higher than the setting voltage Vc, which means the current oscillation frequency of the VCO 11 deviates toward a higher frequency, then the processing section 24 lowers the control signal from the current value, or "1000", by the specified incremental step "D", thereby lowering the oscillation frequency of the VCO 11 at step 140.

On the other hand, if the tune voltage TUNE from the loop filter 12 is lower than the setting voltage Vc at step 130, which means the current oscillation frequency deviates toward a lower frequency, then the processing section 24 raises the control signal from the current value, or "1000", by the incremental step "D" thereby raising the oscillation frequency of the VCO at step S150.

Subsequently, the processing section 24 judges at step S160 whether or not the incremental step "D" is equal to $1_{10}$. If the incremental step "D" is $1_{10}$, then the processing section 24 finishes the processing. If the incremental step "D" is larger than $1_{10}$, then the processing section 24 lowers the incremental step "D" by half at step S180, and returns to step S120 thereby iterating steps S120 to S160 until it is judged that the incremental step "D" assumes $1_{10}$.

By iterating the above processing so long as the PLL circuit is powered, the control signal is set at a suitable value to control the tune voltage TUNE from the loop filter 12 within the vicinity of the setting voltage Vc, whereby the oscillation frequency of the VCO is controlled within a suitable range.

In a modification of the above embodiment, the operation shown by FIG. 9 is performed for a single loop after the PLL circuit is powered, and the control signal at which the optimum frequency is obtained is stored in a memory. Thereafter, the stored control signal is used for obtaining the output oscillation frequency so long as the PLL circuit is powered.

Figure 10:
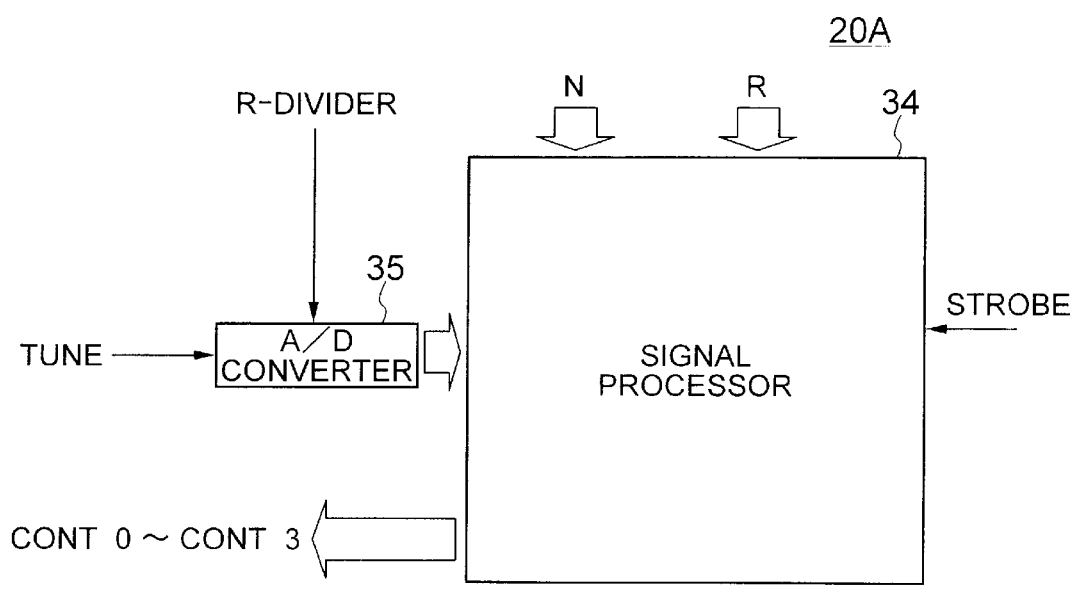
FIG. 10 is a block diagram of a frequency control unit in a PLL circuit according to a second embodiment of the present invention.

Referring to FIG. 10, a frequency control unit 20A in a PLL circuit according to a second embodiment of the present invention includes a signal processor 34, and an analog-to-digital (A/D) converter 35. The tune voltage from the loop filter 12 in FIG. 6 is fed to the A/D converter 35 to be delivered to the signal processor 34 as a digital signal.

Figure 3:
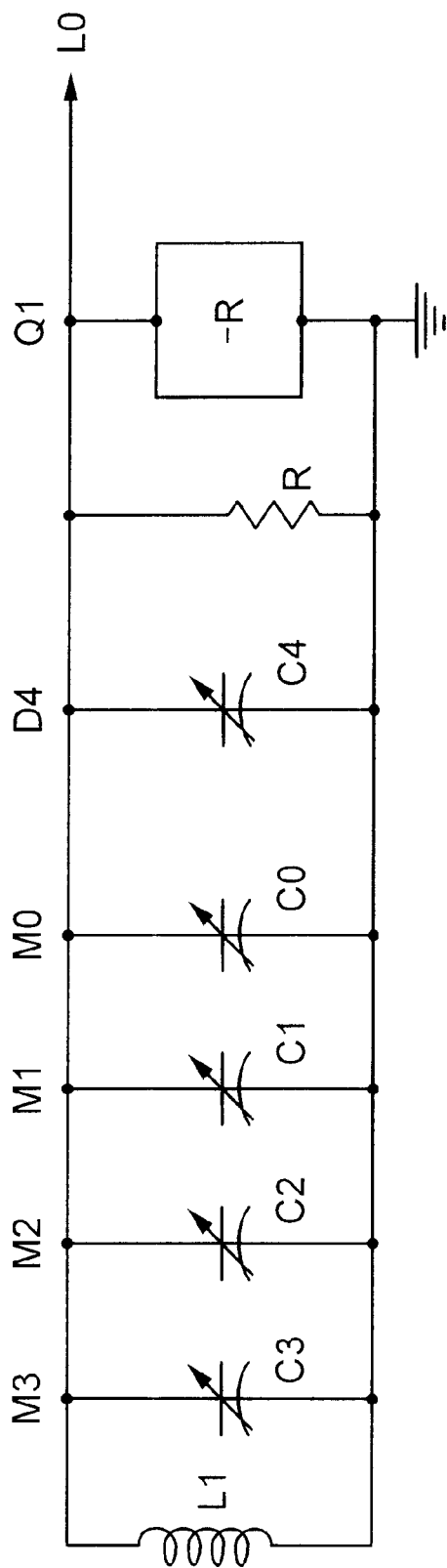
FIG. 3 is a simplified equivalent circuit diagram of the VCO of FIG. 2.
Figure 4:
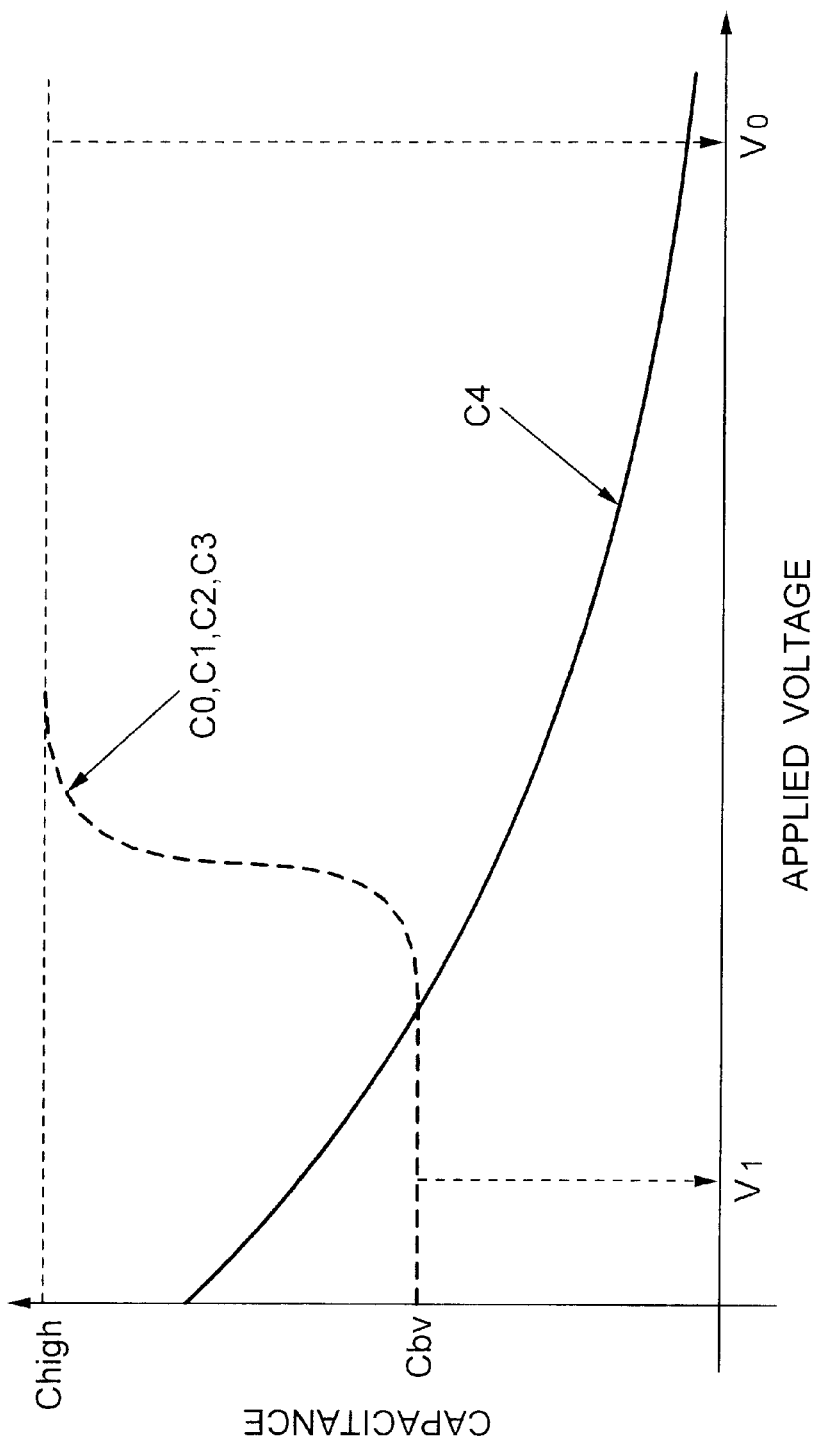
FIG. 4 is a graph showing the applied voltage dependency of the variable capacitances shown in FIG. 3.
Figure 5:
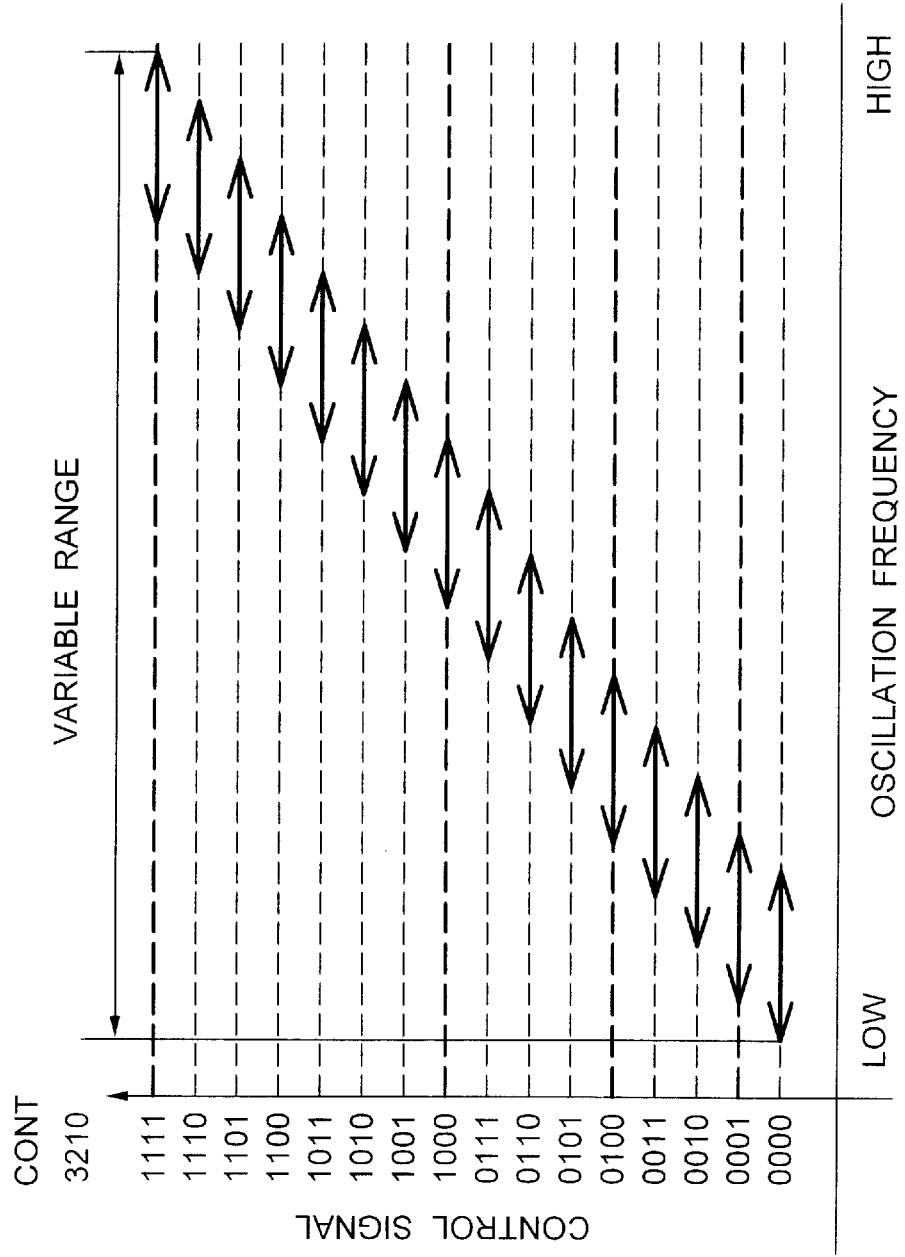
FIG. 5 is a graph showing the oscillation frequency of the VCO of FIG. 3 by adjusting the control voltage and the tune voltage.

The data of numbers N and R stored in the registers 18 and 19 are directly fed to the signal processor 34. The signal processor 34 performs processing such as shown in FIG. 9, similarly to the frequency control unit of FIG. 3.

The PLL circuits according to the above embodiments compensate the deviation of the oscillation frequency caused by a temperature fluctuation and variance or scattering of the electronic components of the PLL circuits. Thus, the PLL circuit of the present invention can be integrated in a LSI without loosing an accuracy of the output oscillation frequency.

Since the above embodiments are described only for examples, the present invention is not limited to the above embodiments and various modifications or alterations can be easily made therefrom by those skilled in the art without departing from the scope of the present invention.

What is claimed is:

1. A phase locked loop (PLL) circuit comprising:
   a reference frequency generator for generating a reference frequency signal having a reference frequency;
   a voltage controlled oscillator (VCO) including first and second variable capacitances, said VCO oscillating at an oscillation frequency based on said first and second variable capacitances;
   a first frequency divider for dividing said oscillation frequency by a first number to output a first frequency signal;
   a phase comparator for comparing a phase of said first frequency signal against a phase of said reference frequency signal to output a comparison result signal;
   a tune signal generation section for receiving said comparison result signal to output a tune signal, said tune signal controlling said first variable capacitance; and
   a frequency control unit for generating a control signal controlling said second variable capacitances;
   said frequency control unit detecting a deviation of said oscillation frequency from a normal oscillation frequency based on said tune signal, said first number and said reference frequency, said frequency control unit correcting said control signal based on said detected deviation.

2. The PLL circuit as defined in claim 1, wherein said frequency control unit includes:
   a normal frequency calculation section for calculating said normal oscillation frequency based on said first number and said reference frequency, a setting voltage calculation section for calculating a setting voltage based on said normal oscillation frequency, a voltage comparator for comparing said tune signal against said setting voltage, and a signal processing section for correcting said control signal based on a result of comparison by said comparator.

3. The PLL circuit as defined in claim 2, wherein said setting voltage and said tune signal are input to said comparator as digital signals.

4. The PLL circuit as defined in claim 1, wherein said reference frequency generator includes a reference frequency oscillator for generating an original frequency, and a second divider for diving said original frequency by a second number to output said reference frequency signal.

5. The PLL circuit as defined in claim 4, wherein said first and second numbers are fed at a timing of a strobe signal from an external CPU.

6. The PLL circuit as defined in claim 1, wherein said tune signal generation section includes a charge pump for responding to said comparison result signal to store/drain charge on/from an output line thereof, and a low-pass filter for passing a low frequency component of a signal transferred on said output line.

7. The PLL circuit as defined in claim 1, wherein said second variable capacitance includes a plurality of variable capacitance components having different capacitances.

8. The PLL circuit as defined in claim 1, further comprising a lock-in detection section for detecting a lock-in of said oscillation frequency with respect to said reference frequency, wherein said frequency control unit detects, upon detection of a lock-in by said lock-in detection section, said deviation of said oscillation frequency.

9. A method for controlling a phase locked loop (PLL) circuit including a voltage controlled oscillator (VCO), said VCO oscillating at an oscillation frequency based on first and second variable capacitances, said method comprising the steps of:
   judging whether or not said oscillation frequency is above a normal oscillation frequency based on a tune voltage controlling said first variable capacitance; and
   correcting a control voltage for said second variable capacitance based on said judging.

10. The method as defined in claim 9, wherein said judging step comprises the steps of:
    calculating a normal oscillation frequency based on said reference frequency;
    calculating a setting voltage based on said reference frequency; and
    comparing said tune voltage against said setting voltage.

11. The method as defined in claim 10, wherein said normal oscillation frequency calculating step uses a graph plotting said normal oscillation frequency against said tune voltage based on said reference frequency and characteristics of said first variable capacitance.

12. The method as defined in claim 9, wherein said steps are iterated until said normal oscillation frequency is obtained by said VCO.

13. The method as defined in claim 12, wherein said steps are iterated after said normal oscillation frequency is obtained so long as said PLL circuit is powered.

14. The method as defined in claim 12, wherein said normal oscillation frequency is stored in a memory after said normal oscillation frequency is obtained.

15. The method as defined in claim 9, wherein said judging step is conducted at the timing of detection of lock-in of said oscillation frequency with respect to a reference frequency.

* * * * *